United States Patent [19]

Masuoka et al.

[11] Patent Number: 4,814,841

[45] Date of Patent: Mar. 21, 1989

[54] SEMICONDUCTOR DEVICE

[75] Inventors: Fujio Masuoka; Kiyofumi Ochii, both of Yokohama, Japan

[73] Assignee: Kabushiki Kaisha Toshiba, Kawasaki, Japan

[21] Appl. No.: 9,559

[22] Filed: Jan. 30, 1987

Related U.S. Application Data

[63] Continuation of Ser. No. 772,679, Sep. 5, 1985, abandoned.

[30] Foreign Application Priority Data

Sep. 6, 1984 [JP] Japan ............................ 59-186862

[51] Int. Cl.[4] ............................................ H01L 29/78
[52] U.S. Cl. ................................... 357/23.7; 357/42; 357/46; 357/55; 357/71 P; 357/59
[58] Field of Search ................ 357/237, 42, 46, 55, 357/59 G, 59 I, 59 J, 71 P

[56] References Cited

U.S. PATENT DOCUMENTS

| | | | |
|---|---|---|---|
| 4,272,880 | 6/1981 | Pashley | 357/23.7 |
| 4,276,688 | 7/1981 | HSU | 357/23.7 |
| 4,333,099 | 6/1982 | Tanguay et al. | 357/23.7 |
| 4,476,475 | 10/1984 | Naem et al. | 357/42 |
| 4,554,572 | 11/1985 | Chatterjee | 357/42 |

OTHER PUBLICATIONS

EP—A—O 096 734, (Tokyo Shibaura Denki K.K.).
IEEE Journal of Solid—State Circuits, vol. SC—17, No. 2, Apr. 1982, pp. 177-183, IEEE, New York, US.
Patents Abstracts of Japan, vol. 7, No. 58 (E—163), [1203], 10th, Mar. 1983.
Solid State Technology, vol. 24, No. 1, Jan. 1981, pp. 65-72, 92, Port Washington, New York, US.
IEEE Electron Device Letters, vol. EDL—4, No. 8, Aug. 1983, pp. 272-274.

*Primary Examiner*—Edward J. Wojciechowicz
*Attorney, Agent, or Firm*—Finnegan, Henderson, Farabow, Garrett & Dunner

[57] ABSTRACT

A semiconductor device which comprises an N channel MOS transistor deposited on a P conductivity substrate, a P channel MOS transistor mounted on said N channel MOS transistor, and a high melting metal layer interposed between the drain regions of said first and second MOS transistors in a direction perpendicular to the surface of said semiconductor device to thereby effect ohmic contact between said drain regions.

5 Claims, 3 Drawing Sheets

SEMICONDUCTOR DEVICE

This application is a continuation of application Ser. No. 772,679, filed Sept. 5, 1985, now abandoned.

BACKGROUND OF THE INVENTION

This invention relates to a semiconductor device comprising an MOS (metal oxide semiconductor) transistor of a first channel type formed on a semiconductor substrate, and an MOS transistor of a second channel type formed on said first MOS transistor with a common gate electrode interposed therebetween.

FIG. 1 represents a conventional inverter circuit comprised of complementary channel type MOS transistors. Referring to the circuit diagram of FIG. 1, the P channel MOS transistor 1 and N channel MOS transistor 2 are connected in series between the power source voltage $V_{DD}$ and a ground. The gates of the MOS transistors 1 and 2 are jointly connected to an input terminal INPUT. The drains of the MOS transistors 1 and 2 are connected together and their junction constitutes the output terminal of the inverter circuit, and is connected to an output terminal OUTPUT. FIG. 2 is a sectional view of the inverter circuit of FIG. 1. Referring to FIG. 2, an N+ drain region 12 and N+ source region 13 are formed in a P conductivity substrate 11 with a certain space allowed therebetween. An $SiO_2$ film 15 is deposited on the substrate r11 involving the above-mentioned N+ drain and source regions 12 and 13. Formed on that portion of an $SiO_2$ film 15 which faces the intervening space between the aforesaid N+ regions 12 and 13 (the channel region) is a gate electrode 14 composed of an N+ polysilicon layer.

An N channel MOS transistor is constituted by N+ regions 12 and 13, a chanel region provided in that portion of the substrate 11 which lies between said N+ regions 12 and 13, an $SiO_2$ film 15, and an N+ polysilicon film which is provided as a gate electrode 14. An $SiO_2$ film 19 is deposited on the N+polysilicon gate electrode 14. An N+ channel region 18 is laid on that region of the $SiO_2$ film 19 which faces the polysilicon gate electrode 14. A P+ semiconductor drain region 16 is provided on the $SiO_2$ films 15 and 19. A PN junction is provided between the P+ drain region 16 and N+ channel region 18. The P+ drain region 16 lies above the N+ region 12. A P+ semiconductor source region 17 is deposited on the $SiO^2$ films 15 and 19. A PN junction is provided between the P+ source region 17 and N+ channel region 18. The P+ source region 17 lies above the N+ region 13. The above-mentioned P+ regions 16 and 17, N+ region 18, N+ polysilicon gate electrode 14 and $SiO_2$ film 15 jointly constitute the P channel MOS transistor. The drain region 12 of the N channel MOS transistor and the drain region 16 of the P channel MOS transistor are electrically connected by means of an N+ polysilicon layer 20 and aluminum layer 21. Reference numeral 22 represents an $SiO_2$ film, and reference numeral 23 denotes a PSG film acting as a passivation film.

In the above-mentioned conventional inverter circuit of FIG. 2, the drain region 12 of the N channel MOS transistor mounted on the silicon substrate 11, and the drain region 16 of the P channel MOS transistor deposited on said N channel MOS transistor are connected by an aluminum layer 21 to effect ohmic contact between both drain regions 12 and 16. If the N+ type drain region 12 is made to contact the P+ type drain region 16 directly, a PN junction is formed on said contact plane. In this case, a potential barrier of a certain magnitude is generated at the PN junction, making it impossible to establish ohmic contact between both drain regions 12 and 16. The aluminium layer 21 ensures ohmic contact between the N+ drain region 12 and P+ drain region 16. In the conventional inverter circuit, the drain regions 12 and 16 contact the aluminium layer 21 lengthwise along the surface of the inverter circuit in such a manner that the contact planes do not overlap each other. Therefore, a large area has to be provided on the substrate to allow for contact between the aluminium layer 21 and drain regions 12 and 16, thereby limiting the degree to which integration of the conventional inverter circuit can be improved.

FIG. 3 shows the pattern of a memory cell involving the conventional inverter circuit. FIG. 4 indicates the schematic circuit diagram of said memory cell. Reference numerals B, $\bar{B}$ denote bit lines, and W represents a word line. Reference numeral 31 (FIG. 3) shows an N+ diffusion region formed in the P semiconductor substrate. Reference numerals 32 and 33 denote aluminium layers for effecting connection between the drain regions of complementary channel type MOS transistors. Reference numerals 34 to 37 (FIG. 4) indicate MOS transistors jointly constituting a flip-flop circuit. Reference numerals 38 and 39 show MOS transistors acting as transfer elements. As seen from FIG. 3, the memory cell arranged as described above causes the aluminium layers to contact the drain regions over a consideraly large area.

SUMMARY OF THE INVENTION

This invention has been accomplished in view of the above-mentioned circumstances, and is intended to provide a semiconductor device of the stacked MOS type wherein the drain regions of the complementary MOS transistors contact each other in as small an area as possible, thereby improving the degree to which the subject semiconductor device can be integrated.

According to the invention, there is provided a semiconductor device which comprises a first MOS transistor of a first channel type formed on a semiconductor substrate; a second MOS transistor of a second channel type deposited on said first MOS transistor; and an electrically conductive layer interposed between the drain region of said first MOS transistor and the drain region of said second MOS transistor to effect ohmic contact therebetween.

DETAILED DESCRIPTION OF THE PREFERRED EMBODIMENT

Figure 1:
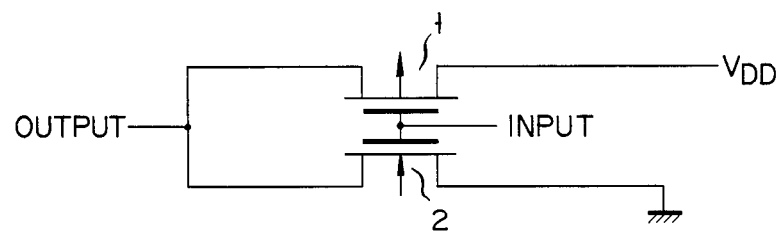
FIG. 1 is a circuit diagram of an inverter comprised of complementary channel type MOS transistors.
Figure 2:
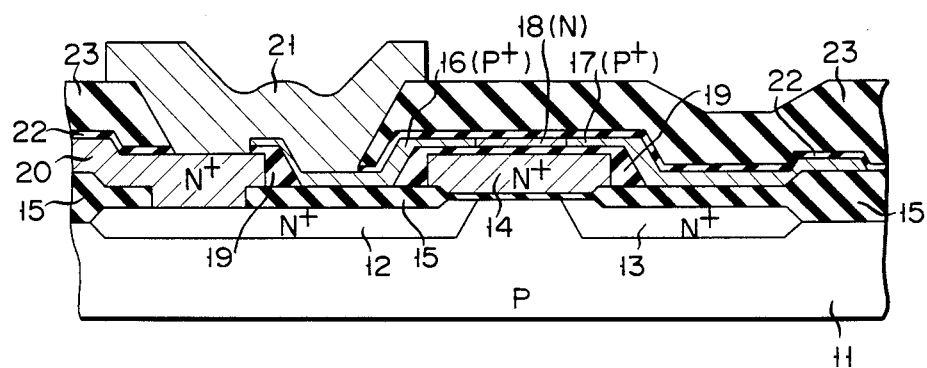
FIG. 2 is a sectional view of a conventional semiconductor device wherein the inverter circuit of FIG. 1 is comprised of a stacked CMOS arrangement.
Figure 5:
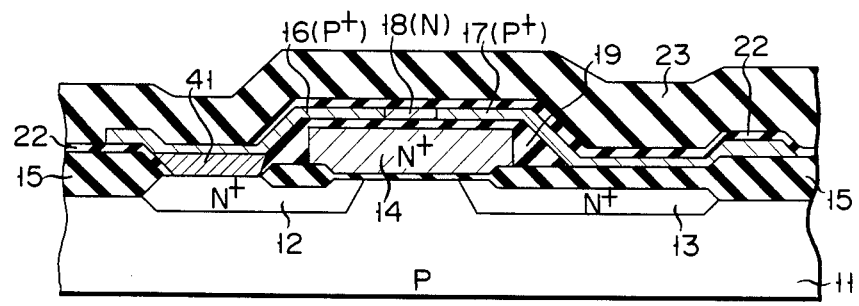
FIG. 5 is a sectional view of the semiconductor device embodying this invention.
Figure 6:
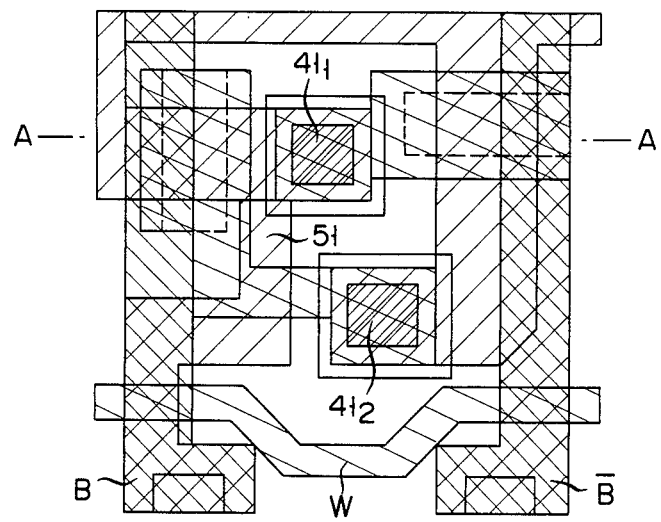
FIG. 6 illustrates the pattern of an inverter unit comprised of the semiconductor device of FIG. 5.
Figure 7:
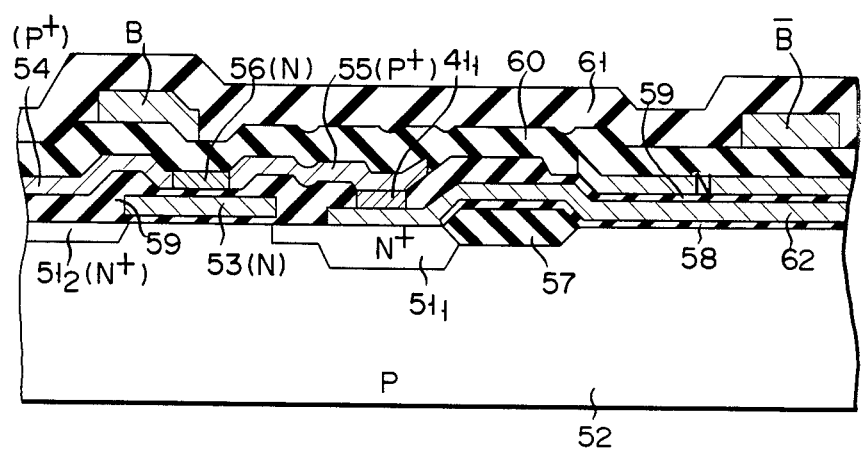
FIG. 7 is a sectional view along line A—A of the inverter unit of FIG. 6.

Description may now be made, with reference to FIGS. 5 to 7, of the semiconductor device embodying this invention. The arrangement shown in FIGS. 5 to 7 represents the application of this invention to a complementary MOS stacked inverter circuit. FIG. 5 depicts a sectional view of said inverter circuit as it corresponds to FIG. 2 which depicts the prior art. The parts of FIG. 5 that are the same as those of FIG. 2 are denoted by the same numerals for clarity and ease of understanding. Referring to FIG. 5, high impurity N+ source and drain reegions 12 and 13 are formed in a P silicon substrate 11 at a prescribed interval. An $SiO_2$ film 15 is deposited over the major surface of the P silicon substrate 11, including N+ regions 12 and 13, but excluding the region in which a high melting metal layer 41 is formed. The high melting metal layer 41 is deposited on the drain region 12. On the $SiO_2$ film 15, an N+ polysilicon film 14 is deposited on that region of the semiconductor substrate 11 which is defined between the N+ regions 12 and 13, namely, the channel region.

An N channel MOS transistor is comprised of N+ regions 12 and 13, a semiconductor region (channel region) defined between the N+ regions 12 and 13, N+ polysilicon film 14 and that region of the $SiO_2$ film 15 which is interposed between the N+ polysilicon film 14 and the semiconductor channel region. As previously mentioned, the N+ region 12 is a drain region on which the high melting metal layer 41 is deposited, and the N+ region 13 is a source region. An $SiO_2$ film 19 is formed on the N+ polysilicon film 14. An N region 18 is provided on a region substantially facing the central section of the N+ polysilicon film 14. A P+ drain region 16 is provided in contact with the N region 18 in such a manner that the P+ drain region 16 extends over an $SiO_2$ film 19 as well as the high melting metal layer 41. A P+ source region 17 is provided in contact with the N region 18 in such a manner that the P+ source region 17 extends over the $SiO_2$ film 19 as well as that portion of the $SiO_2$ film 15 which faces the N+ region 13.

The P+ regions 16 and 17, N region 18, $SiO_2$ film 19 and N+ polysilicon film 14 jointly constitute a P channel MOS transistor. The P+ region acts as a drain region and the P+ region 17 acts as a source region. The film 14 constitutes a gate electrode. The N+ drain region 12 of the N channel MOS transistor and the P+ drain region 16 of the P channel MOS transistor are electrically connected by the N+ polysilicon film 14. The N+ drain region 12 and P+ drain region 16 overlap each other, with the N+ polysilicon film 14 interposed therebetween in a direction perpendicular to the surface of the semiconductor device. An $SiO_2$ film 22 is deposted on the P+ regions 16 and 17 and N+ region 18. A PSG (phosphorous silicate glass) film 23 is spread over the main surface of the subject semiconductor device, inclduing the $SiO_2$ film 22.

The semiconductor device of this invention is characterized in that the drain regions 12 and 16 of the complementary channel type MOS transistor are electrically connected by means of the layer 41 which has a high melting point. The layer 41 ohmically contacts the drain regions 12 and 16 which overlap each other along the length of the surface of the subject semiconductor device.

The above-mentioned arrangement of this invention dispenses with the aluminium film 21 which was applied in the conventional semiconductor device to attain ohmic contact between said drain regions 12 and 16. Namely, the conventional semiconductor device has the drawback whereby the drain regions 12 and 16 and the aluminium film 21 can not be arranged in an overlapping fashion in order to ensure their ohmic contact, thereby unavoidably enlarging the contact area of these elements. In contrast, the semiconductor device of this invention need not be provided with the aluminium film 21, thereby ensuring the degree to which integration of the device can be improved.

The metal film 41 can be provided by the steps of forming an N channel MOS transistor on, for example, the P silicon substrate 11, drilling a hole in that portion of the $SiO_2$ film 15 which faces the N+ drain region 12 in order to expose the N+ drain region 12, and depositing a high melting point metal on the N+ drain region 12 through the hole. The high melting point metal should be of the type fully capable of withstanding the annealing temperature applied during formation of the P channel MOS transistor.

FIG. 6 illustrates the pattern of a static memory cell involving the inverter circuit of this invention. FIG. 7 is a sectional view along line A-A of the static memory cell of FIG. 6. Throughout FIGS. 6 and 7, the same parts are denoted by the same numerals. However, the sizes of the various parts of FIGS. 6 and 7 do not always accord with each other. Referring to FIG. 7, N+ drain and source regions $51_1$ and $51_2$, repectively are provided in a P type semiconductor substrate 52 at a prescribed interval. An $SiO_2$ film 59 is deposited on the substrate 52 including said N+ drain and source regions $51_1$ and $51_2$. An N polysilicon film 53 is provided as a gate electrode in that region (channel region) of the $SiO_2$ film 59 which faces the section of the semiconductor substrate 52 which is defined between the N+ drain and source regions $51_1$ and $51_2$. An N semiconductor layer 56 is formed as a channel region on that region of the $SiO_2$ film 59 which faces the N polysilicon film 53. A PN junction is provided between the N layer 56 and $SiO_2$ film 59. A P+ semiconductor drain layer 55 extends over a region facing the N+ drain region $51_1$. A P+ semicondcutor source layer 54 extends over a region facing the N+ source region $51_2$. The above-mentioned N+ drain and source regions $51_1$ and $51_2$, that portion (channel region) of the substrate 52 which is defined between the N+ drain and source regions $51_1$ and $51_2$, polysilicon film 53 acting as a gate electrode, and $SiO_2$ film 59 collectively constitute an N channel MOS transistor. A P channel MOS transistor is constituted by N layer 56, P+ layer 54 acting as a source region, P+ layer 55 acting as a drain region, N polysilicon region 53 applied as a gate electrode, and $SiO_2$ film 59.

Figure 3:
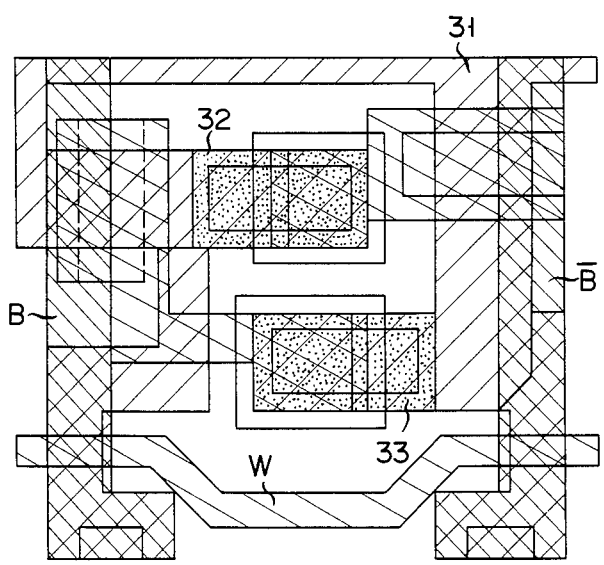
FIG. 3 shows the pattern of a memory cel comprising the inverter device of FIG. 2.
Figure 4:
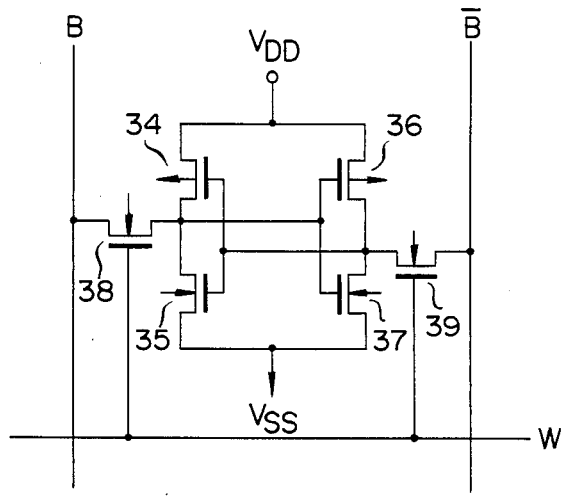
FIG. 4 is an equivalent circuit diagram of the memory cell of FIG. 3.

A polysilicon layer 62 is formed on the N+ drain region $51_1$. A high melting point metal layer $41_1$ is deposited on the polysilicon layer 62. The high melting point metal layer $41_1$ contacts the P+ drain region 55, causing the drain regions $51_1$ and 55 to be electrically connected. Throughout FIGS. 6 and 7, reference numerals 57, 58, 60 are $SiO_2$ films, and reference numeral 61 denotes a PSG film acting as a passivation film. Letter W represents a word line, and letters B, $\overline{B}$ denote bit lines. Reference numeral $41_2$ of FIG. 6 also shows the high melting point metal layer. Ohmic contact is effected between the drain of the P channel MOS transistor and that of the N chanel MOS transistor by the intervening high melting point metal layer 41, $41_1$ or $41_2$. As compared with the conventional semiconductor device shown in FIGS. 3 and 4, therefore, the semiconductor device of this invention can be reduced in size and, consequently, integrated with a greater density.

This invention is not limited to the foregoing embodiments. For instance, the high melting point layer may be provided by deposition or pasting of a high melting point metal film, or the aforementioned high melting metal layer 41 may be replaced by a silicide or polycide thereof.

As mentioned above, the stacked CMOS type semiconductor device of this invention is characterized in that a high melting metal layer or silicide, or a polycide thereof, is provided between the drains of CMOS transistors, thereby effecting ohmic contact between the drains, which overlap each other lengthwise along the surface of said semiconductor device, and reducing the area required for said ohmic contact of the drains, noticeably elevating the degree to which the subject semiconductor device can be intregrated.

What is claimed is:

1. A semiconductor device comprising:
   a first MOS transistor of a first channel type formed on a semiconductor substrate;
   a second MOS transistor of a second channel type formed on said first MOS transistor, said second MOS transistor having a gate electrode common to said first MOS transistor, said gate electrode being made of polysilicon; and
   a polysilicon layer and a polycide layer of a high melting metal, which are interposed between the drain region of said first MOS transistor and the drain region of said second MOS transistor, said polysilicon layer being formed on that drain region having a conductivity type the same as said common gate electrode, and said polycide layer being formed on the other drain region.

2. A semiconductor device according to claim 1, said first MOS transistor of said first channel type is an N channel type and said second MOS transistor of said second channel type is a P channel type.

3. A semiconductor device according to claim 1, in which said first MOS transistor of said first channel type is a P channel type and said second MOS transistor of said second channel type is an N channel type.

4. A semiconductor device according to claim 1, in which said conductivity type of said common gate is an N conductivity type.

5. A semiconductor device according to claim 1, in which said conductivity type of said common gate is a P conductivity type.

* * * * *